United States Patent
Kusaka et al.

[11] Patent Number: 6,025,610
[45] Date of Patent: *Feb. 15, 2000

[54] SOLID RELAY AND METHOD OF PRODUCING THE SAME

[75] Inventors: Teruo Kusaka; Mitsuma Ooishi, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/012,208

[22] Filed: Jan. 23, 1998

[30] Foreign Application Priority Data

Jan. 23, 1997 [JP] Japan ..................................... 9-010654

[51] Int. Cl.[7] ............................. H01L 31/12; H01L 31/16
[52] U.S. Cl. ............................ 257/82; 257/113; 257/116; 257/459
[58] Field of Search .......................... 257/40, 82, 84–85, 257/113–114, 116, 81, 459; 313/504

[56] References Cited

U.S. PATENT DOCUMENTS

| | | | |
|---|---|---|---|
| 3,096,442 | 7/1963 | Stewart | 257/113 |
| 4,458,408 | 7/1984 | Alonas et al. | 57/113 X |
| 4,888,625 | 12/1989 | Mueller | 257/84 X |
| 5,589,733 | 12/1996 | Noda et al. | 313/509 |

FOREIGN PATENT DOCUMENTS

| | | |
|---|---|---|
| 58-213481 | 12/1983 | Japan . |
| 61-225879 | 10/1986 | Japan . |
| 62-244181 | 10/1987 | Japan . |
| 63-208322 | 8/1988 | Japan . |
| 64-15987 | 1/1989 | Japan . |
| 1-235282 | 9/1989 | Japan . |
| 3-276770 | 12/1991 | Japan . |
| 4-323879 | 11/1992 | Japan ........................................ 257/84 |

OTHER PUBLICATIONS

Partial English translation of Office Action issued by Japanese Patent Office on Dec. 15, 1998.

*Primary Examiner*—John Guay
*Attorney, Agent, or Firm*—Sughrue, Mion, Zinn, MacPeak & Seas, PLLC

[57] ABSTRACT

A solid relay having a light emitter and a photodetector and a method of producing the same are disclosed. A planer thyristor, photodiode, phototransistor or similar photodetector is formed on an Si substrate or wafer. The surface of the photodetector is covered with an $SiO_2$, PSG (Phospher-Silicate Glass) or similar transparent insulation film. An ITO (Indium Tin Oxide) or similar transparent film, an organic thin film and a metal electrode are sequentially formed on the transparent insulation film, constituting a light emitter. The laminate is separated from the wafer in the form of a chip by dicing. The chip is bonded to a lead frame, connected to the leads of a lead frame by wire bonding, and then sealed with epoxy resin or similar resin.

10 Claims, 15 Drawing Sheets

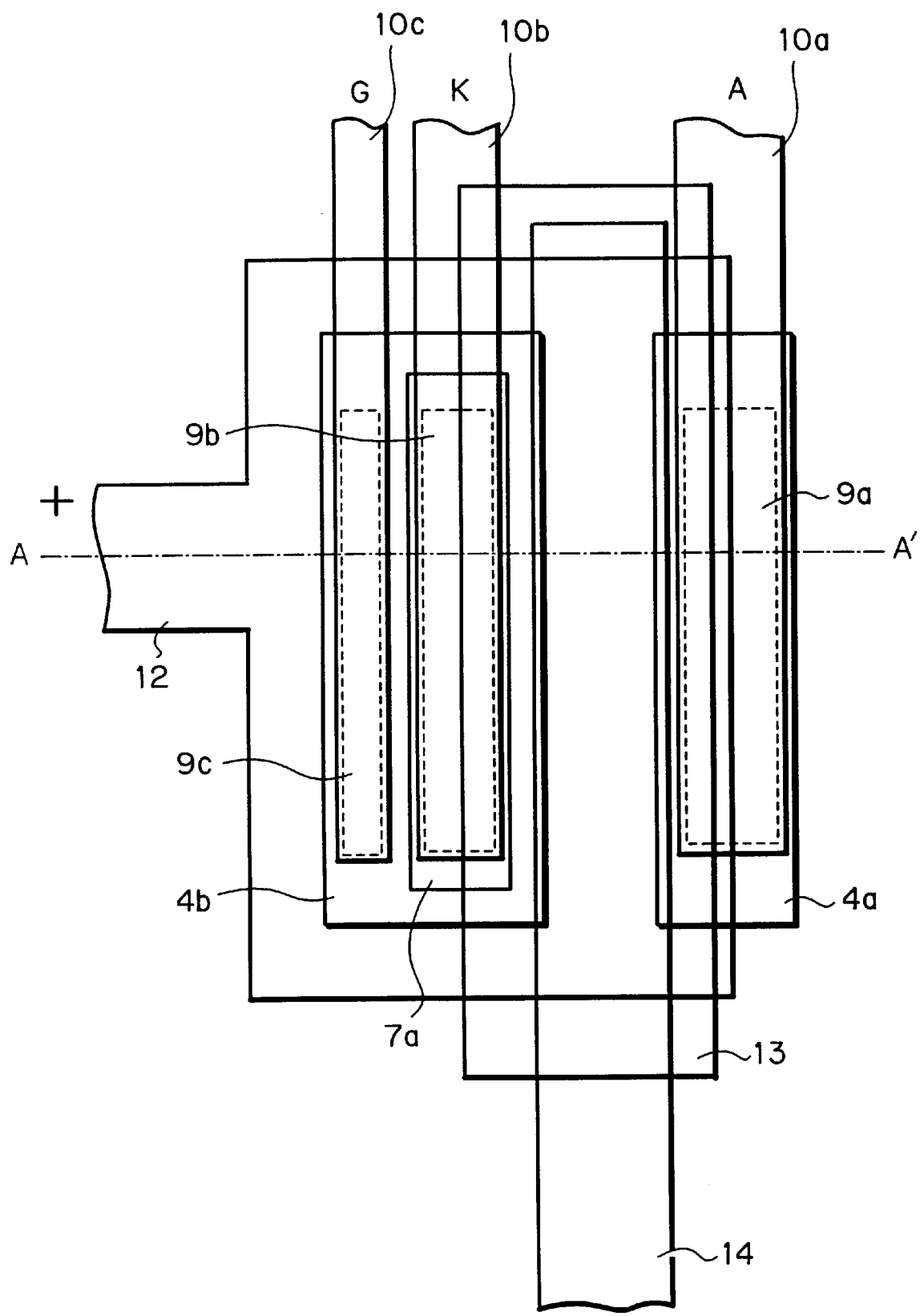

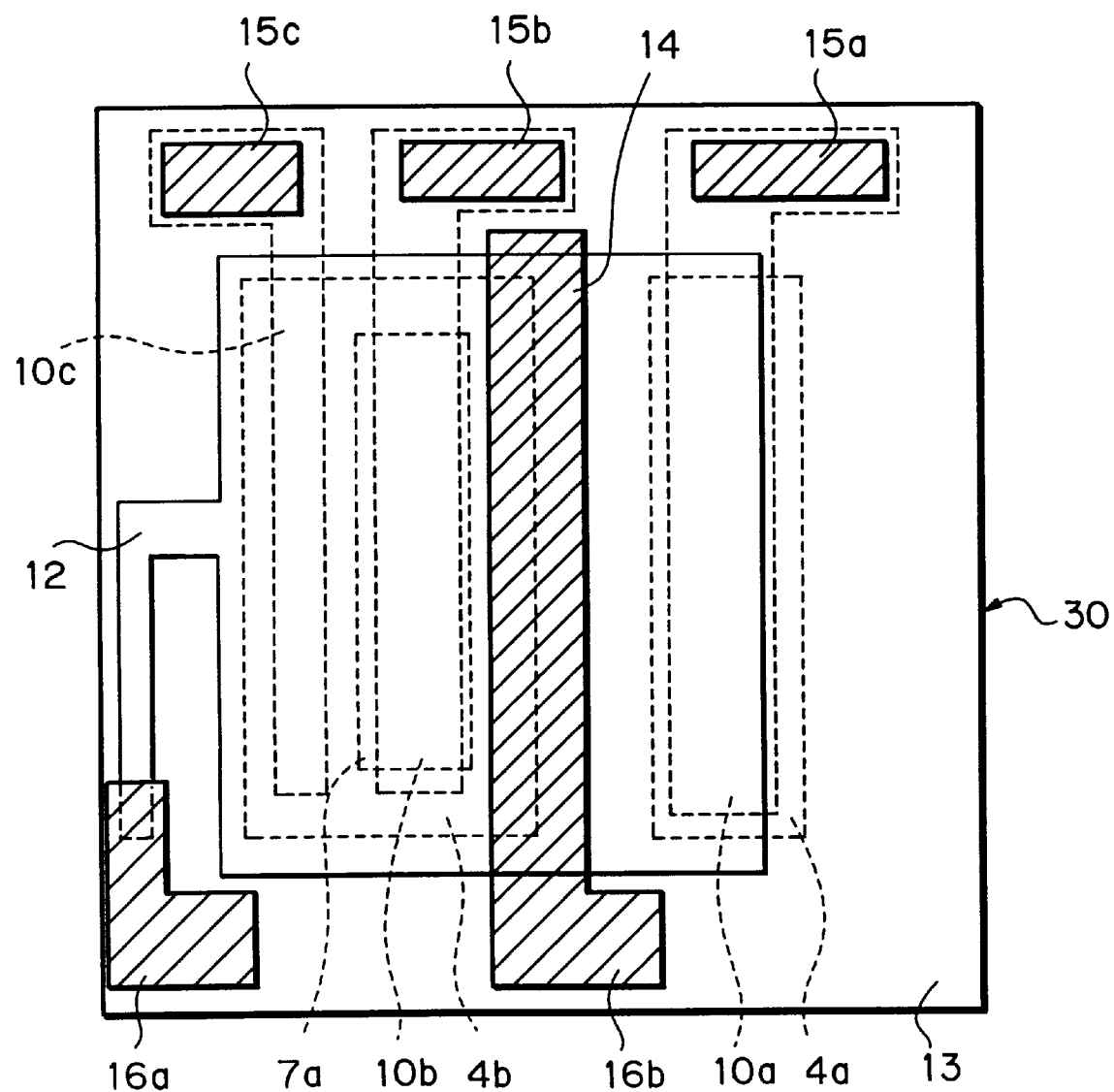

SOLID RELAY AND METHOD OF PRODUCING THE SAME

BACKGROUND OF THE INVENTION

The present invention relates to a solid relay and a method of producing the same and, more particularly, to a solid relay having a light emitter and a photodetector in an unitary configuration and easy to produce, and a method of producing the same.

Japanese Patent Laid-Open Publication No. 58-213481 teaches a photocoupler whose structure is closest to the above light emitter and photodetector constructed integrally with each other. To produce the photocoupler, ternary AlGaAs mixed crystal semiconductor layers each having a thickness of less than several ten microns inclusive are formed on a GaAs crystal substrate by liquid-phase epitaxial growth. Specifically, an N type AlGaAs layer is formed on the major surface of the GaAs crystal substrate. Then, P type AlGaAs layers and N type AlGaAs layers are formed on the above N type AlGaAs layer alternately with each other. The resulting four- or five-layer block constitute a light emitter and a photodetector.

However, the photocoupler having the above configuration has some problems left unsolved although its light emitter and photodetector are formed integrally with each other. First, the light emitter and photodetector are not separate from each other as to insulation. Second, use cannot be made of an Si device predominant over compound semiconductor devices in characteristic, stability and cost and extensively used. Third, considering semiconductor devices in general, the photocoupler needs a special crystal material and a special production process, i.e., exclusive facilities and production line.

In the art of solid relays to which the present invention pertains, it is a common practice to separate a GaAs light emitter (light emitting diode or LED) and an Si photodetector (photodiode or phototransistor) and optically couple them during assembly or packaging.

Technologies relating to the present invention are also disclosed in, e.g., Japanese Patent Laid-Open Publication Nos. 61-225879 and 63-208322.

SUMMARY OF THE INVENTION

It is therefore an object of the present invention to provide a solid relay having a stable device characteristic, easy to produce, and low cost, and a method of producing the same.

A solid relay for controlling power or current at an output side in response to a control signal input to an input side of the present invention has a light emitter located at the input side, and a photodetector located at the output side and optically coupled to the light emitter. The photodetector is a planer Si device while the light emitter is a thin film EL device formed on an $SiO_2$ film covering the planer Si device.

BRIEF DESCRIPTION OF THE DRAWINGS

The above and other objects, features and advantages of the present invention will become apparent from the following detailed description taken with the accompanying drawings in which:

FIG. 3 is a front view showing a first embodiment of the solid relay in accordance with the present invention;

FIG. 7 is a plan view of the first embodiment in the form of a chip;

DESCRIPTION OF THE PREFERRED EMBODIMENTS

Figure 1:
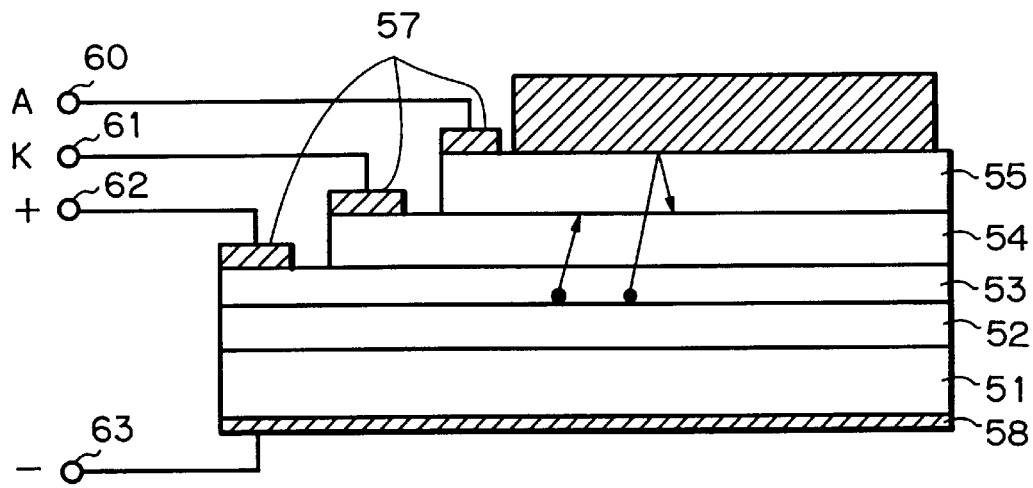
FIG. 1 is a section showing a conventional photocoupler.

To better understand the present invention, brief reference will be made to a conventional photocoupler, shown in FIG. 1. The photocoupler to be described is taught in Japanese Patent Laid-Open Publication No. 58-213418 mentioned earlier and having a light emitter and a photodetector in a unitary structure. As shown, the photocoupler includes a GaAs crystal substrate 51 and multiple ternary AlGaAs mixed crystal semiconductor layers formed on the substrate 51 and each having a thickness of less than several ten microns inclusive. A ternary mixed crystal semiconductor layer is characterized in that by changing the composition ratio, it is possible to laminate N type layers and P type layers continuously. Specifically, an N type AlGaAs layer 52 is formed on the major surface of the GaAs substrate 51. Then, a P type AlGaAs layer 53, an N type AlGaAs layer 54 and a P type AlGaAs layer 55 are sequentially formed on the N type AlGaAs layer 52. The N type layers and P-type layers alternating with each other constitute a block. The layers 52 and 53 form a light emitter while the layers 54 and 55 form a photodetector. There are also shown in FIG. 1 a reflection film 56, electrode layers 57 and 58, output lead terminals 60 and 61, and input lead terminals 62 and 63.

Figure 2A:
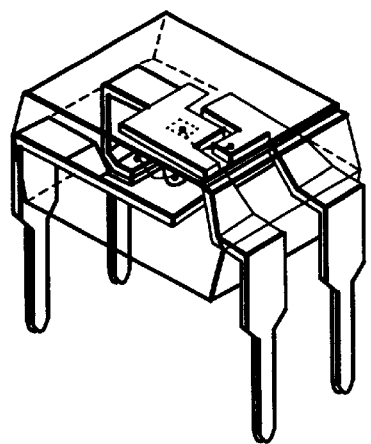
FIGS. 2A and 2B are respectively a perspective view and a section showing a conventional solid relay.
Figure 2B:
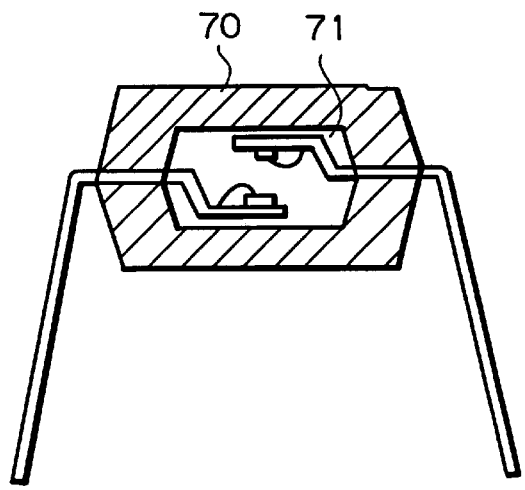

FIGS. 2A and 2B show a specific structure of a conventional solid relay to which the present invention pertains and extensively used in the solid relays art. As shown, a GaAs light emitter (LED) and an Si photodetector (photodiode or phototransistor) are separate from each other. The light emitter and photodetector are optically coupled to each other when assembled into a package. The reference numerals 70 and 71 respectively designate black outer resin and white inner resin.

Preferred embodiments of the solid relay in accordance with the present invention will be described hereinafter.

1st Embodiment

Reference will be made to FIGS. 3–9 for describing a solid relay embodying the present invention. Briefly, in the illustrative embodiment, an $SiO_2$ film is formed on the major surface of an Si substrate. After holes have been formed in the $SiO_2$ film, an impurity opposite in conductivity type to the Si substrate is diffused in the substrate so as to form, e.g., two first diffusion layers. A second diffusion layer is formed in either one of the first diffusion layers, and then preselected metal electrodes are formed. Subsequently, the entire surface of the laminate is covered with a transparent protection layer for thereby completing a thyristor (switching device with a PNPN structure). A transparent electrode, an organic thin film and a metal electrode are sequentially formed on the protection film in this order. Up to this stage of fabrication, the laminate is dealt with in the form of a wafer. After a chip has been separated from the wafer, a solid relay is produced in the same manner as a semiconductor IC (Integrated Circuit), i.e., by die bonding the chip to the island of a lead frame, connecting it to the leads of a lead frame by wire bonding, and then sealing it with resin.

Figure 4A:
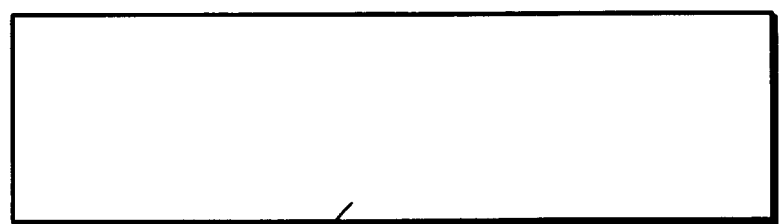
FIGS. 4A–4E are sections demonstrating a sequence of steps for producing the solid relay shown in FIG. 3.
Figure 4B:
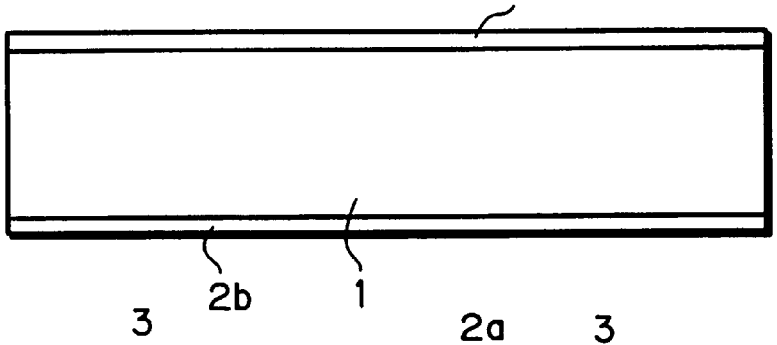
Figure 4C:
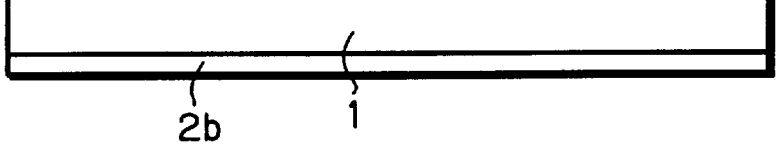
Figure 4D:
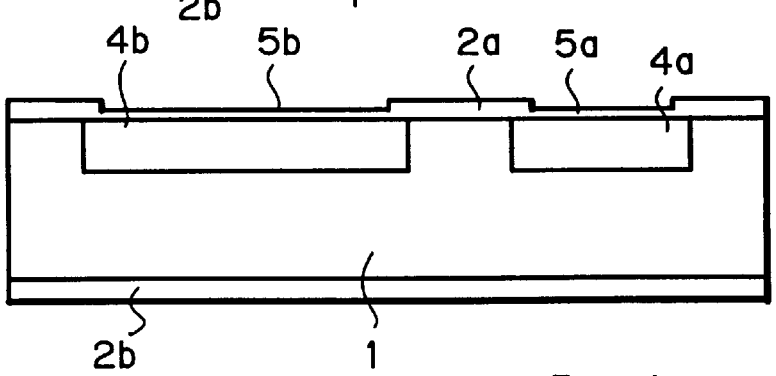
Figure 4E:
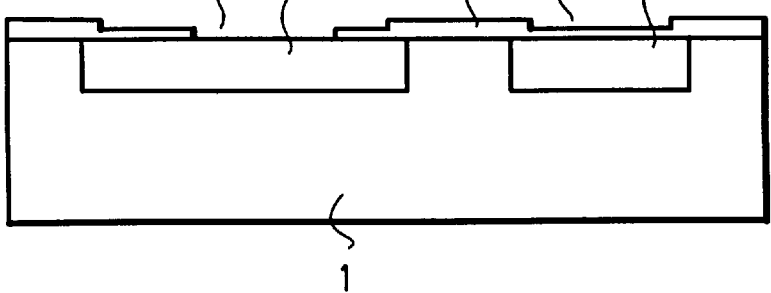

Specifically, as shown in FIG. 4A, an Si substrate 1 in the form of a wafer is prepared which has a thickness of 0.5 mm to 1 mm and a diameter of 6 mm to 12 inches and doped with phosphor or similar N type impurity. As shown in FIG. 4B, a 0.5 μm to 1.5 μm thick $SiO_2$ film 2 is formed on the substrate 1 by, e.g., thermal oxidation executed at at 900° C. to 1,200° C. for 0.5 hour to 10 hours. Let the portion of the $SiO_2$ film 2 formed on the front of the wafer and the portion formed on the rear of the wafer be referred to as $SiO_2$ films 2a and 2b, respectively. Subsequently, as shown in FIG. 4C, a plurality of holes 3 are formed in the $SiO_2$ film 2a by photolithography. Boron or similar P type impurity is diffused in the substrate 1 via the holes 3 at, e.g., 900° C. to 1,200° C. for 0.5 hour to 3 hours. As a result, as shown in FIG. 4D, two first diffusion layers 4a and 4b are formed in the substrate 1. At this instant the P type impurity is not diffused to the rear of the substrate 1 due to the $SiO_2$ layer. It is to be noted that the two first diffusion layers 4a and 4b are only illustrative and may be replaced with any other suitable number of diffusion layers. During the thermal diffusion effected in the oxidizing atmosphere, $SiO_2$ films 5a and 5b newly grow on the diffusion layers 4a and 4b, respectively. As shown in FIG. 4E, a hole 6 is formed in the grown $SiO_2$ film 5b by photolithography. At this time, the rear $SiO_2$ film 2b is removed.

Figure 5A:
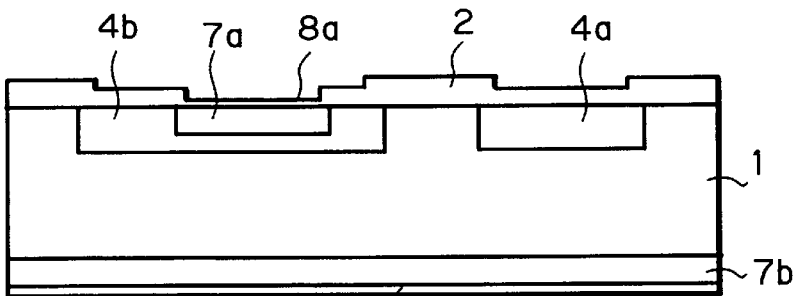
FIGS. 5A–5E are sections showing a sequence of steps following the steps shown in FIGS. 4A–4E.
Figure 5B:
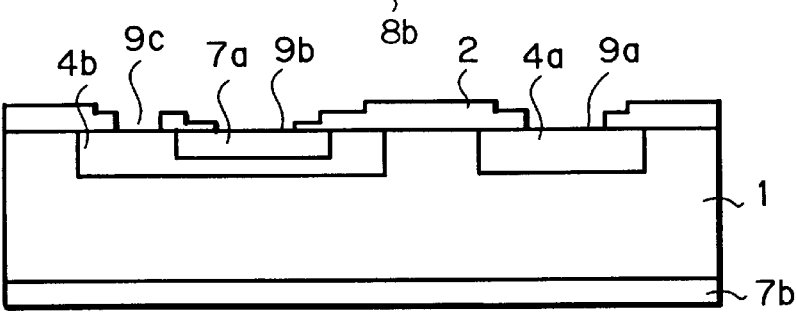

Subsequently, phosphor or similar N type impurity is diffused at, e.g., 850° C. to 1,100° C. for 0.25 hour to 1.5 hours via the hole 6 of the $SiO_2$ film 5b and the rear of the substrate 1. As a result, as shown in FIG. 5A, two second diffusion layers 7a and 7b are formed in the first diffusion layer 4b and the rear of the substrate 1, respectively. During the thermal diffusion, $SiO_2$ films 8a and 8b newly grow in the same manner as during the formation of the first diffusion layers 4a and 4b. As shown in FIG. 5B, holes 9a, 9b and 9c are respectively formed in the $SiO_2$ films 5a, 8a and 5b in order to implement contact for electrodes. At the same time, the rear $SiO_2$ film 8b is removed.

Figure 5C:
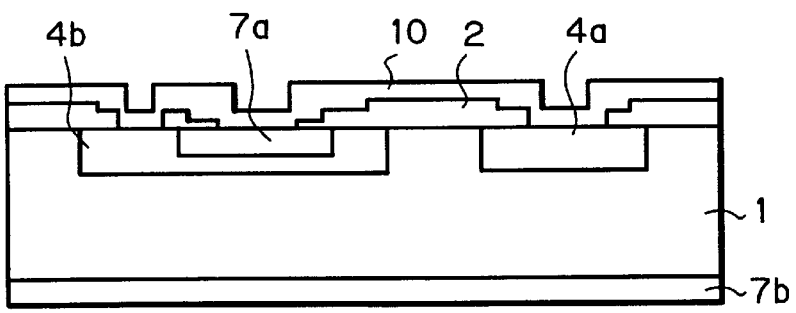
Figure 5D:
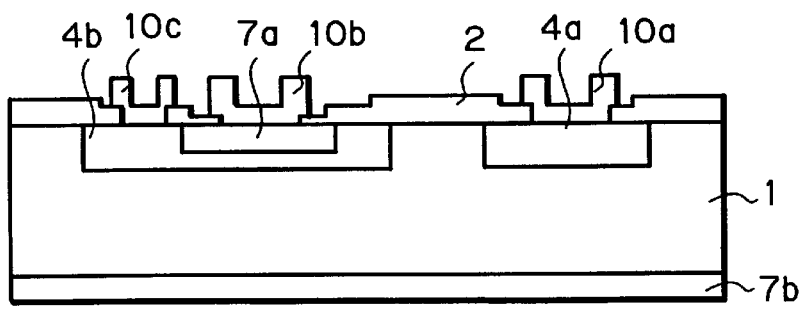
Figure 5E:
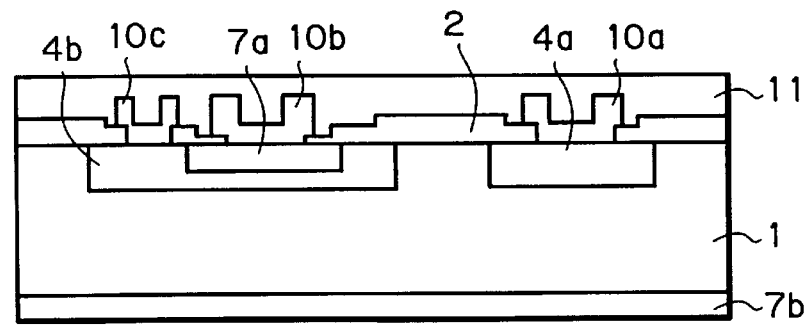

As shown in FIG. 5C, a thin film of Al or similar metal 10 is formed on the front of the entire laminate by sputtering or similar technology. Then, as shown in FIG. 5D, the metal film 10 is patterned in order to form electrodes 10a, 10b and 10c which respectively constitute the anode, cathode and gate of a thyristor, as will be described specifically later. Subsequently, as shown in FIG. 5E, the front of the laminate is covered with an $SiO_2$ film, phosphor-silicate glass (PSG) film or similar transparent protection film 11 formed by CVD (Chemical Vapor Deposition). As shown in FIG. 7, the protection film 11 is formed with holes 15a, 15b and 15c, so that wires to be connected to the leads of a lead frame can be bonded. The holes 15a–15c are used to lead out the anode, cathode and gate of the thyristor, respectively. The Si device (thyristor) produced by the above procedure will constitute a light-sensitive switching device when the relay is completed. The procedure described so far can be implemented by a general-purpose thyristor production line. Stated another way, the above Si device can be implemented by a thyristor picked out from the general-purpose thyristor production line.

Figure 6A:
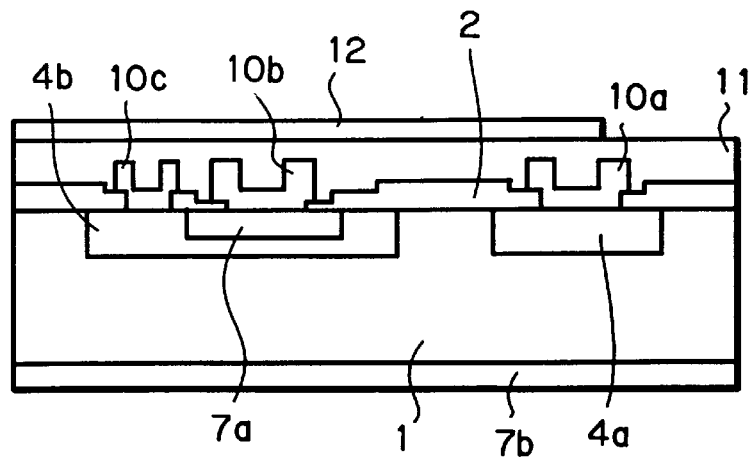
FIGS. 6A–6C are sections showing a sequence of steps following the steps shown in FIGS. 5A–5E.
Figure 6B:
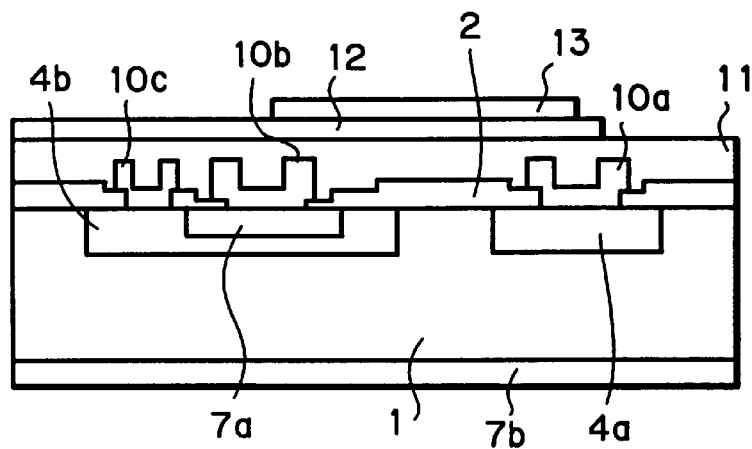
Figure 6C:
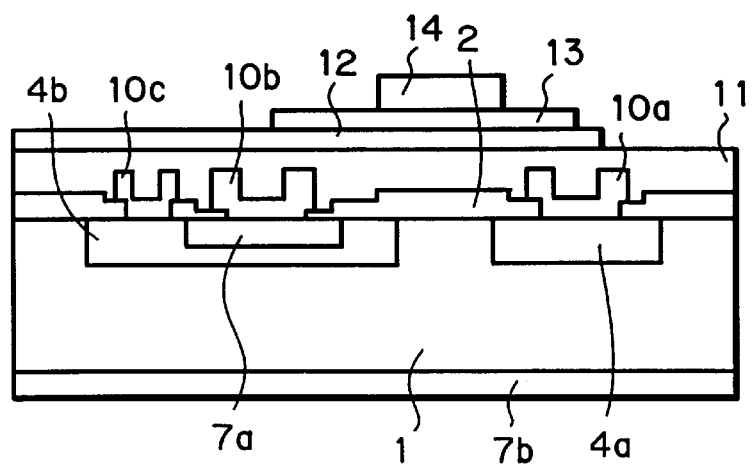

FIGS. 6A–6C show a sequence of steps for producing a light emitter. First, as shown in FIG. 6A, an ITO (Indium Tin Oxide) film or similar transparent electrode 12 is formed by sputtering or ion plating on the Si device produced by the procedure shown in FIGS. 5A–5E. As shown in FIG. 3, the transparent electrode 12 is patterned by photoetching, as seen in a plan view. The ITO film may, of course, be replaced with an $SnO_2$, $In_2O3$ or $ZnO_2$ film by way of example. Further, the electrode 12 may be implemented by an Au film as thin as several angstroms and transparent.

As shown in FIG. 6B, a 800 angstroms to 3,000 angstroms organic thin film 13 is formed on the transparent electrode 12 by CVD or similar technology. As FIG. 3 indicates, the organic film 13 is patterned. In the illustrative embodiment, the organic film 13 is patterned by a shadow mask method using a metal mask. In detail, the organic film 13 is a laminate of two to five layers or even more layers constituting a hole implantation layer, a hole transport layer, a light emitting layer, an electron transport layer, and an electron implantation layer. While the organic film 13 may be formed of any material applicable to organic thin film electroluminescence (EL) devices and capable of forming a film when subjected to CVD, the material should preferably be highly resistive to heat. Typically, use may advantageously be made of a laminate consisting of a light emitter implemented by an Al complex of oxine, a hole transport layer implemented by tetra- or penta-triphenylamil derivative or starbast amine derivative, and an electron transport layer implemented by a branched oxadiozol derivative. For applications needing high resistivity to heat, the organic thin film EL device may be replaced a thin film EL device using zinc sulfide (ZnS) or similar inorganic substance.

As shown in FIG. 6C, a metal electrode 14 is formed on the organic film 13 by shadow masking using CVD. The metal electrode 14 is formed of, e.g., Li-doped Al or MgAg having a small work function. At the same time, bonding pads for wire bonding are formed. Specifically, as shown in FIG. 7, bonding pads 16a and 16b are formed in order to lead out the anode and cathode of the organic thin film EL device.

Specific dimensions in a plan view will be described with reference to FIGS. 3 and 7. The first diffusion layers 4a and 4b are respectively sized 100 μm×400 μm and 150 μm×400 μm and spaced from each other by 75 μm. The organic thin film 13 is sized 170 μm×600 μm while the metal electrode 14 is 85 μm wide. The chip size is 0.8 mm×1.0 mm. The bonding pads 16a and 16b and the holes 15a–15c of the protection film 11 are sized 125 μm×125 μm each. Of course, such dimensions are only illustrative.

Figure 8A:
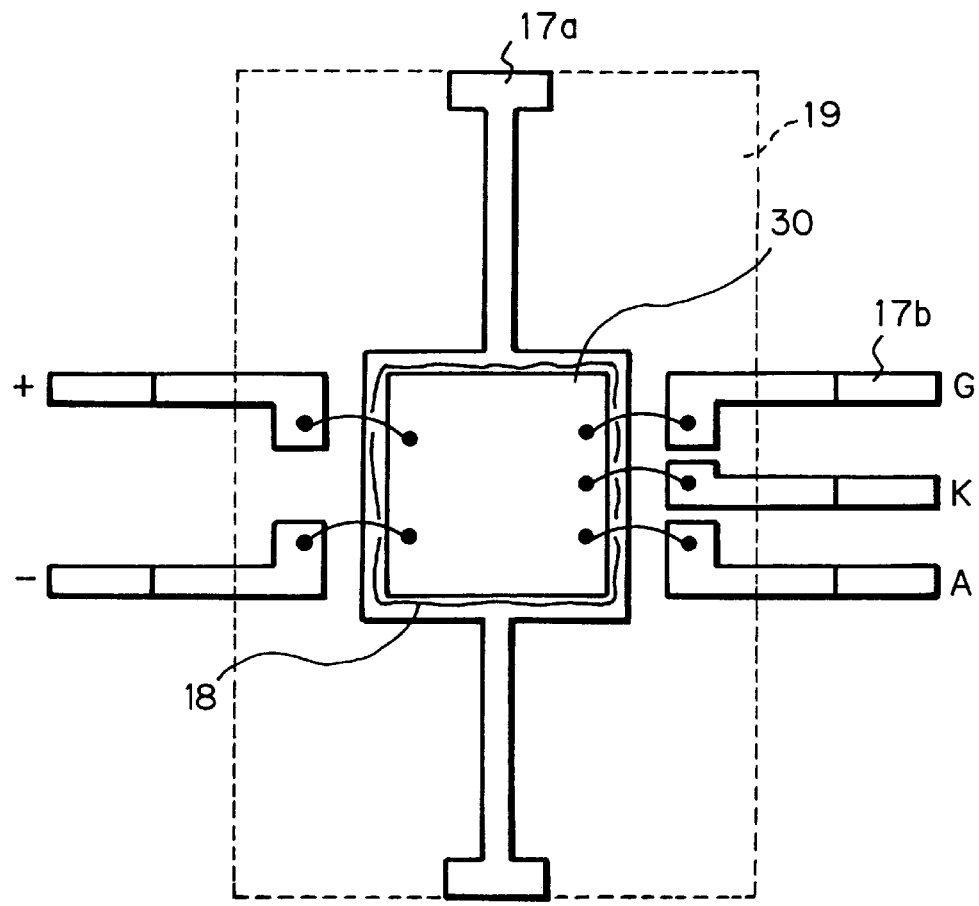
FIGS. 8A and 8B are respectively a plan view and a section showing the first embodiment assembled in the form of a package.
Figure 8B:
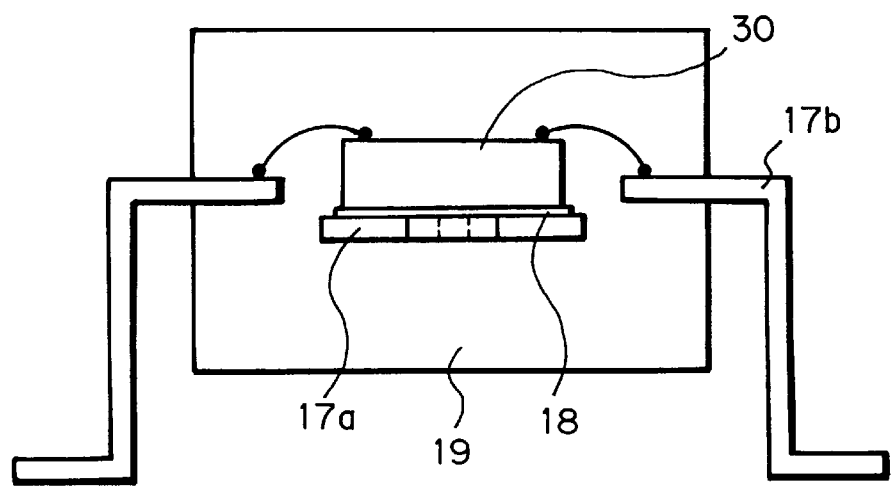

A plurality of laminates are produced on the Si substrate or wafer 1 by the procedure described with reference to FIGS. 5A–5E and 6A–6C. A chip 30 shown in FIG. 7 is produced by dicing the Si substrate 1. As shown in FIGS. 8A and 8B, the chip 30 is bonded to an island 17a included in a lead frame 17 formed of Fe—Ni42 alloy or Cu. For this purpose, use is made of an Ag paste or similar adhesive 18. Then, the chip 30 is connected to leads 17b also included in the lead frame 17 by wire bonding using, e.g., Al wires having a diameter of 25 μm. Subsequently, the chip 30 is sealed and fixed in place by epoxy resin or similar resin 19. After the lead frames are cut off, the leads of the package are trimmed so as to complete a solid relay. Basically, the completed solid relay has four different electrode terminals. Let the electrode terminals of the light emitter be referred to as an anode and a cathode, and let the electrode terminals of the photodetector be referred to as an anode (A) and a cathode (K). An electrode terminal serving as a gate (G) is also shown in FIGS. 8A and 8B and used to adjust the switching sensitivity of the thyristor (photodetector). In practice, a resistor is connected between the gate G and the cathode K in order to control switching sensitivity.

Figure 9:
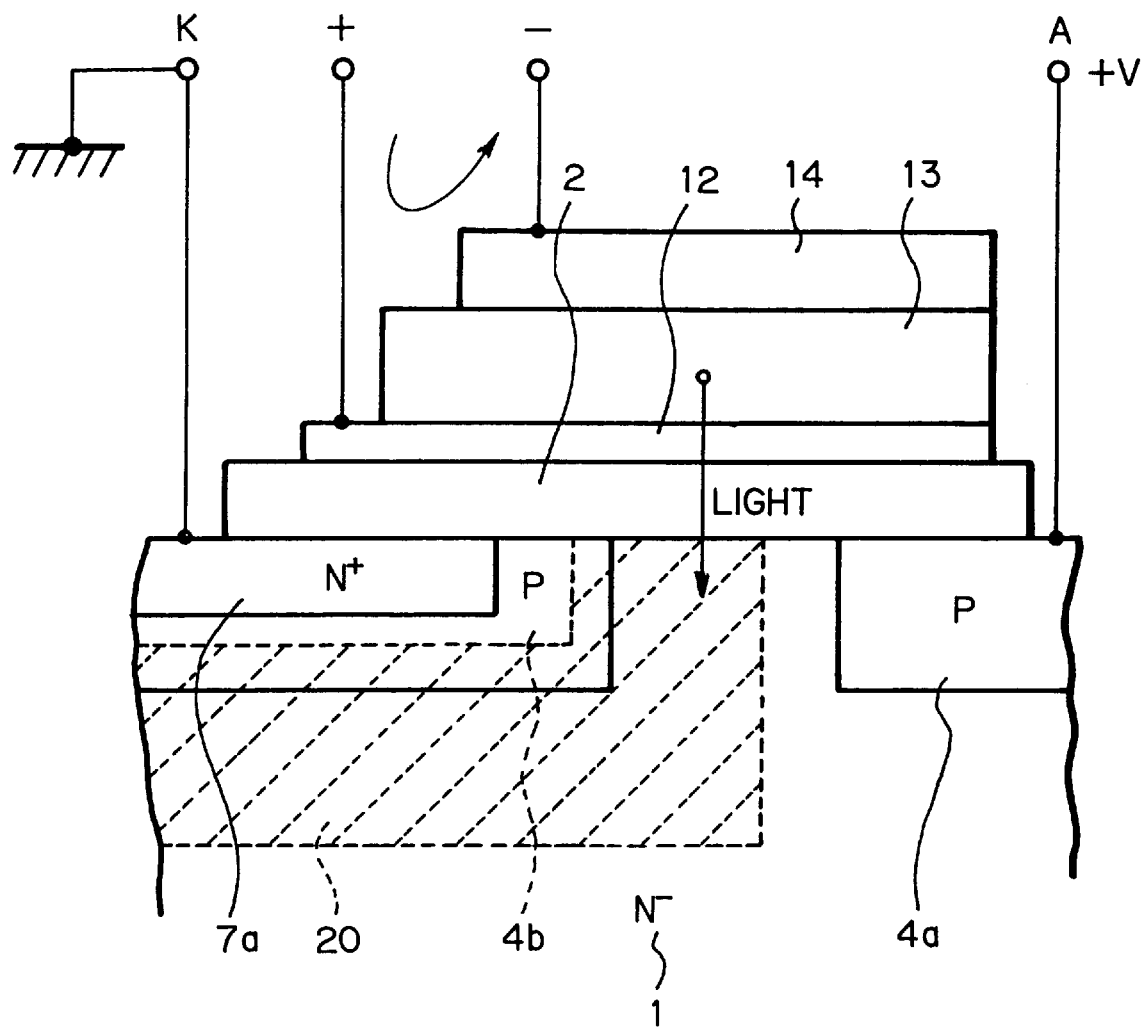
FIG. 9 is a section showing the principle of operation of the first embodiment.

FIG. 9 is a section demonstrating the principle of operation of the above solid relay. Assume that the electrode terminal K is held at a reference potential. Then, the electrode terminal A is biased to a positive potential. As a result, a depletion layer 20 is formed, among the three PN junctions of the thyristor, the PN junction biased in the opposite direction. In this condition, a current does not flow between the electrode terminals A and K, maintaining the thyristor switched off. Assume that a current flows from the anode to the cathode in order to cause the organic thin film EL device (light emitter) to emit light. The light is propagated through the transparent electrode 12 and SiO2 film 2 to be incident to the thyristor. As a result, electron-hole pairs generated in and around the vicinity of the depletion layer 20 migrate due to drift and diffusion. However, the thyristor is switched on due to a trigger current caused to flow through the switching device.

Figure 16:
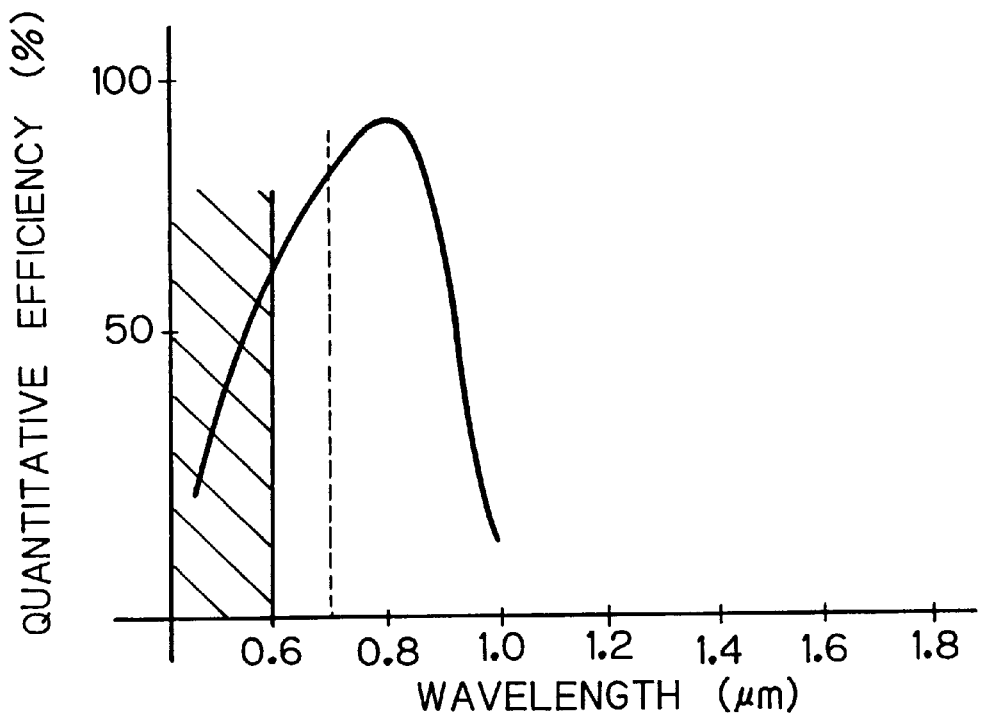
FIG. 16 is a graph showing a relation between the wavelength of an Si crystal and the quantitative efficiency.
Figure 17:
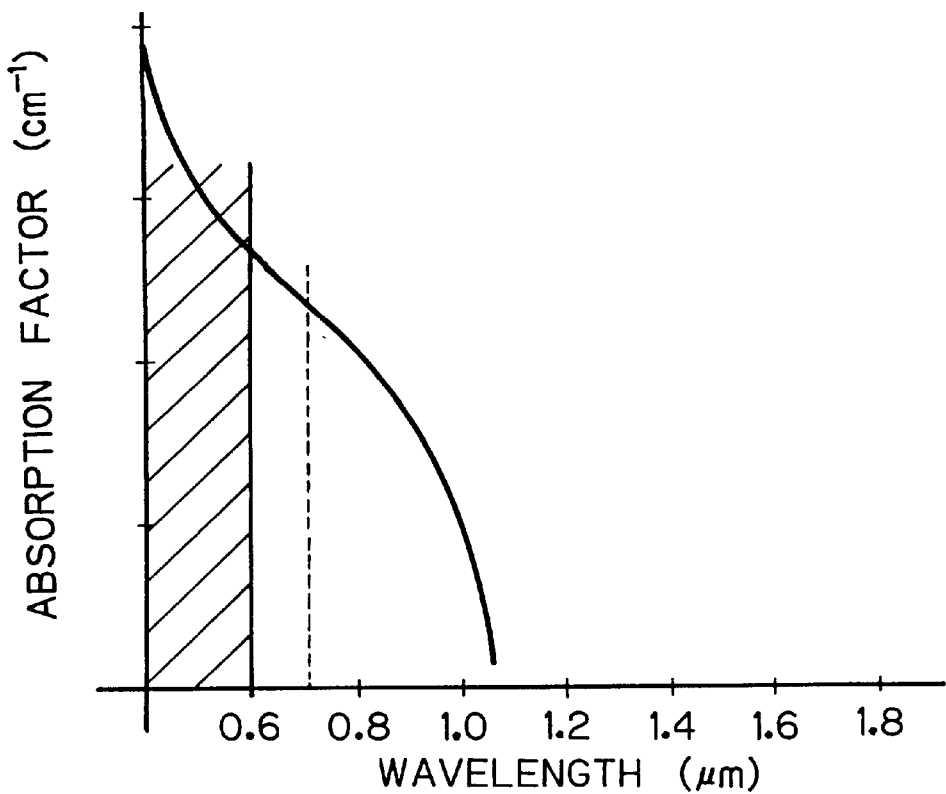
FIG. 17 is a graph showing a relation between the wavelength of an Si crystal and the absorption factor.

To effect the above optical drive, it is necessary to check the emission wavelength of the light emitter and the corresponding electron-hole pairs in the photodetector. In the illustrative embodiment, the organic thin film EL device has an emission length of, typically, 5,000 angstroms to 6,000 angstroms. As for the photodetector or Si element, FIGS. 16 and 17 respectively show a relation between the quantitative efficiency of an Si crystal and the wavelength and a relation between the absorption factor and the wavelength. For the typical wavelength of about 7,000 angstroms available with BaAs-based LEDs in general, the absorption factor is great and prevents light from penetrating deep into the Si crystal, and in addition the quantitative efficiency is low. In principle, therefore, the driving ability is limited. In practice, however, the driving ability is sufficient because optical coupling between emission and receipt is strengthened and because the sensitivity of the thyristor (resistance between the terminals G and K) is adjustable.

Figure 10:
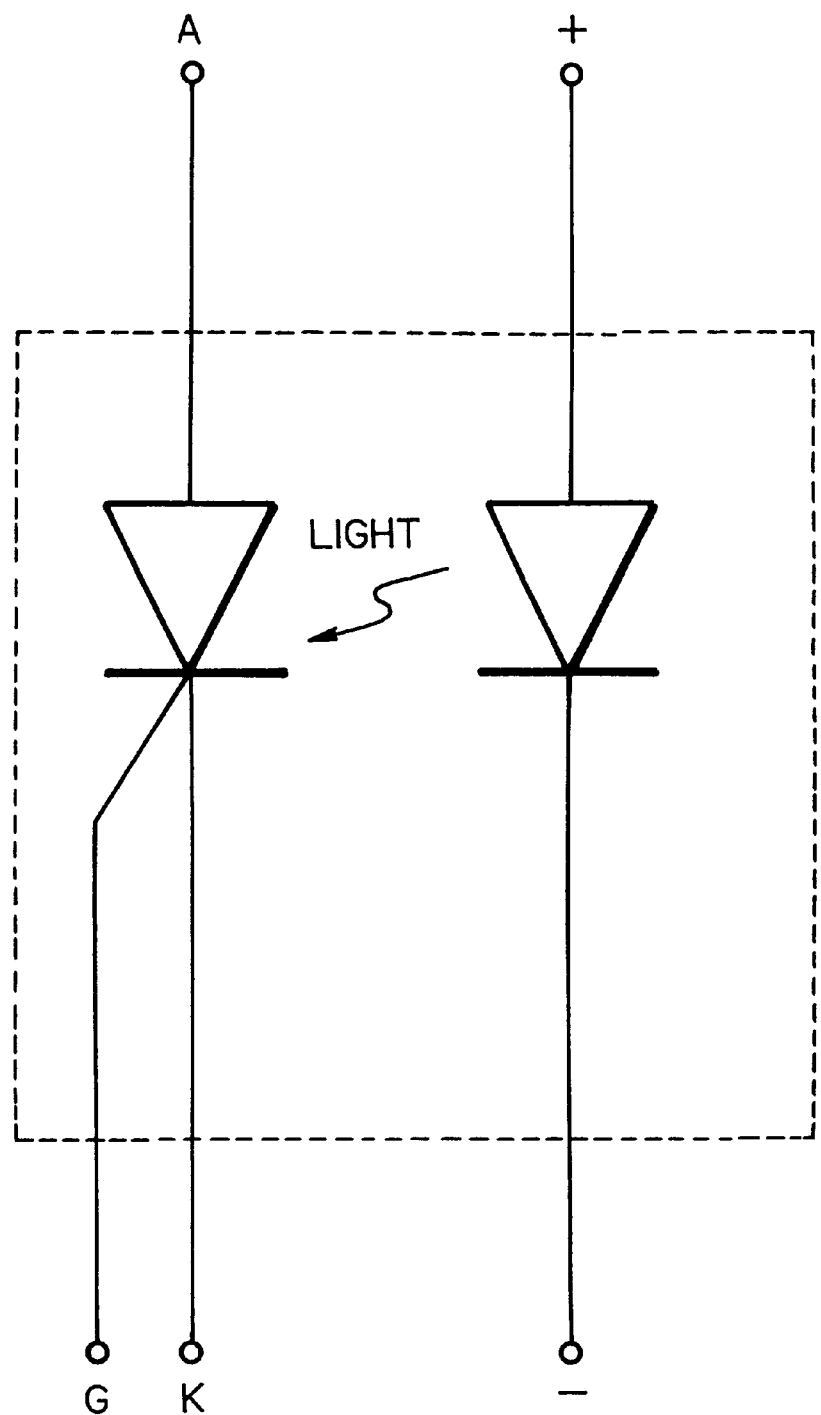
FIG. 10 shows an equivalent circuit representative of the first embodiment.

FIG. 10 shows the relay shown in FIGS. 8A and 8B by using electric symbols. The portion surrounded by a dotted line is representative of the package sealed with the resin 19.

2nd Embodiment

Figure 11:
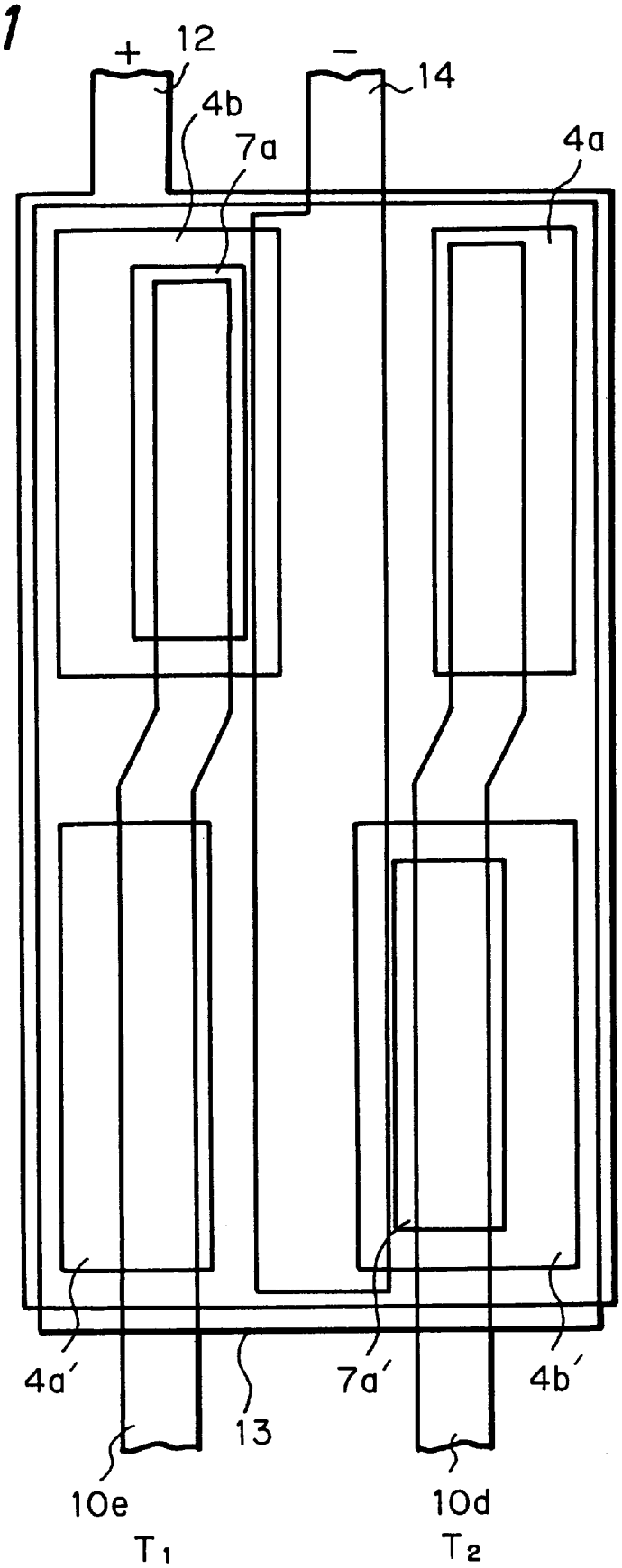
FIG. 11 is a plan view showing a second embodiment of the solid relay in accordance with the present invention.
Figure 12:
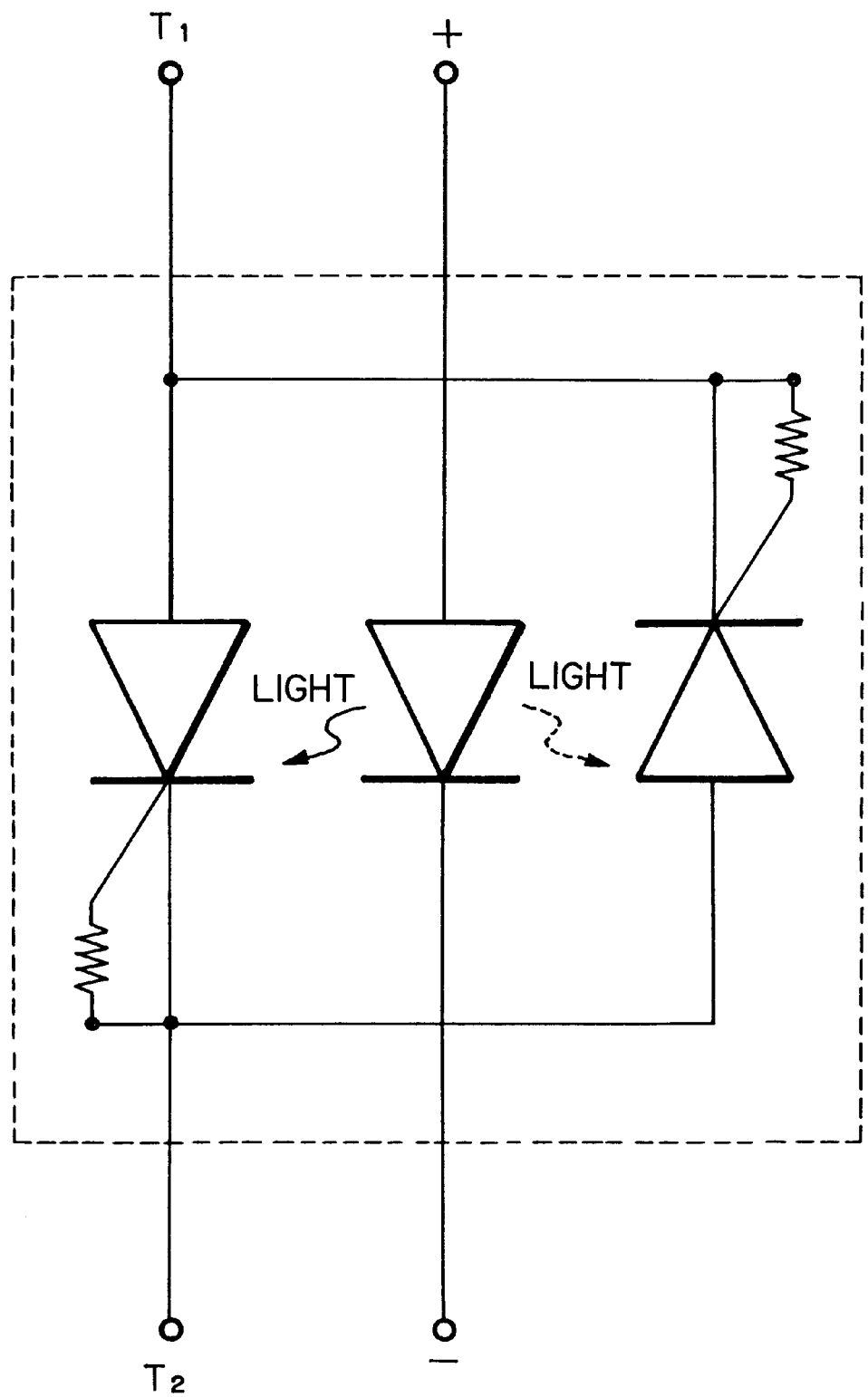
FIG. 12 shows an equivalent circuit representative of the second embodiment.

Referring to FIGS. 11 and 12, a second embodiment of the present invention will be described. While the first embodiment uses a single thyristor implementing the photodetector for a package, the second embodiment uses two thyristors for a package. Briefly, in this embodiment, two thyristors are connected in a reverse parallel configuration in order to constitute a bidirectional switching device and optically driven by the organic thin film EL device. Specifically, two thyristors are formed side by side and connected in a reverse parallel configuration by the metal electrode or wiring 10. In this sense, as shown in FIG. 11, the lead electrodes will be referred to as terminals 1 (T1) and 2 (T2). In the illustrative embodiment, when the first diffusion layers are formed, a diffusion resistor is formed at the same time, although not shown specifically. The diffusion resistor is connected as a resistor between the electrode terminals G and K when the metal electrode 10 is formed. In this configuration, a commercially available power source of AC 100 V is connected between the terminals T1 and T2. A control signal is fed between the anode and the cathode of the relay in order to control the power or current of a main circuit. FIG. 12 shows the relay by using electric symbols; the portion surrounded by a dotted line is representative of the package sealed with the resin 19.

3rd Embodiment

Figure 13:
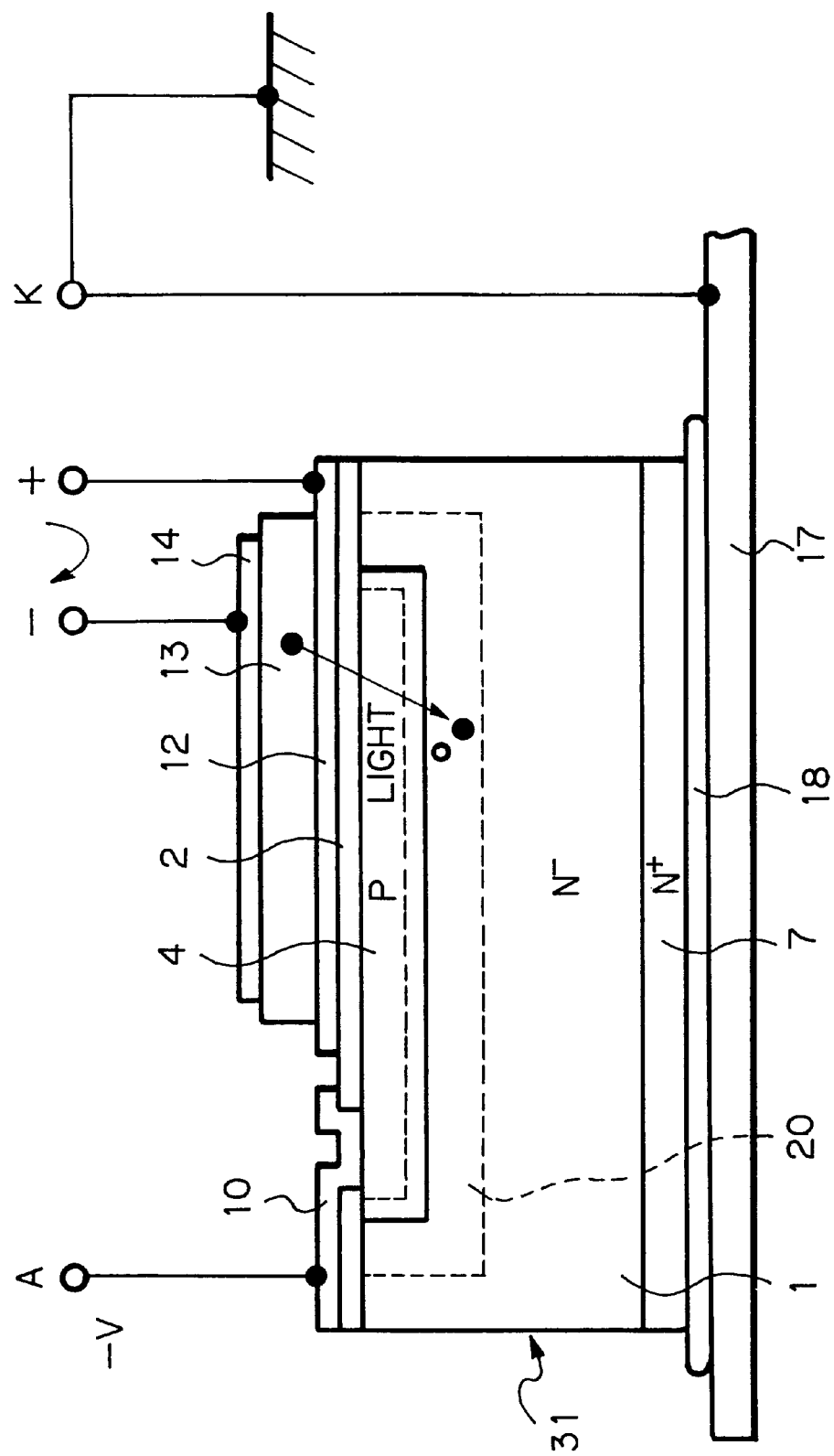
FIG. 13 is a section showing a third embodiment of the solid relay in accordance with the present invention.
Figure 14:
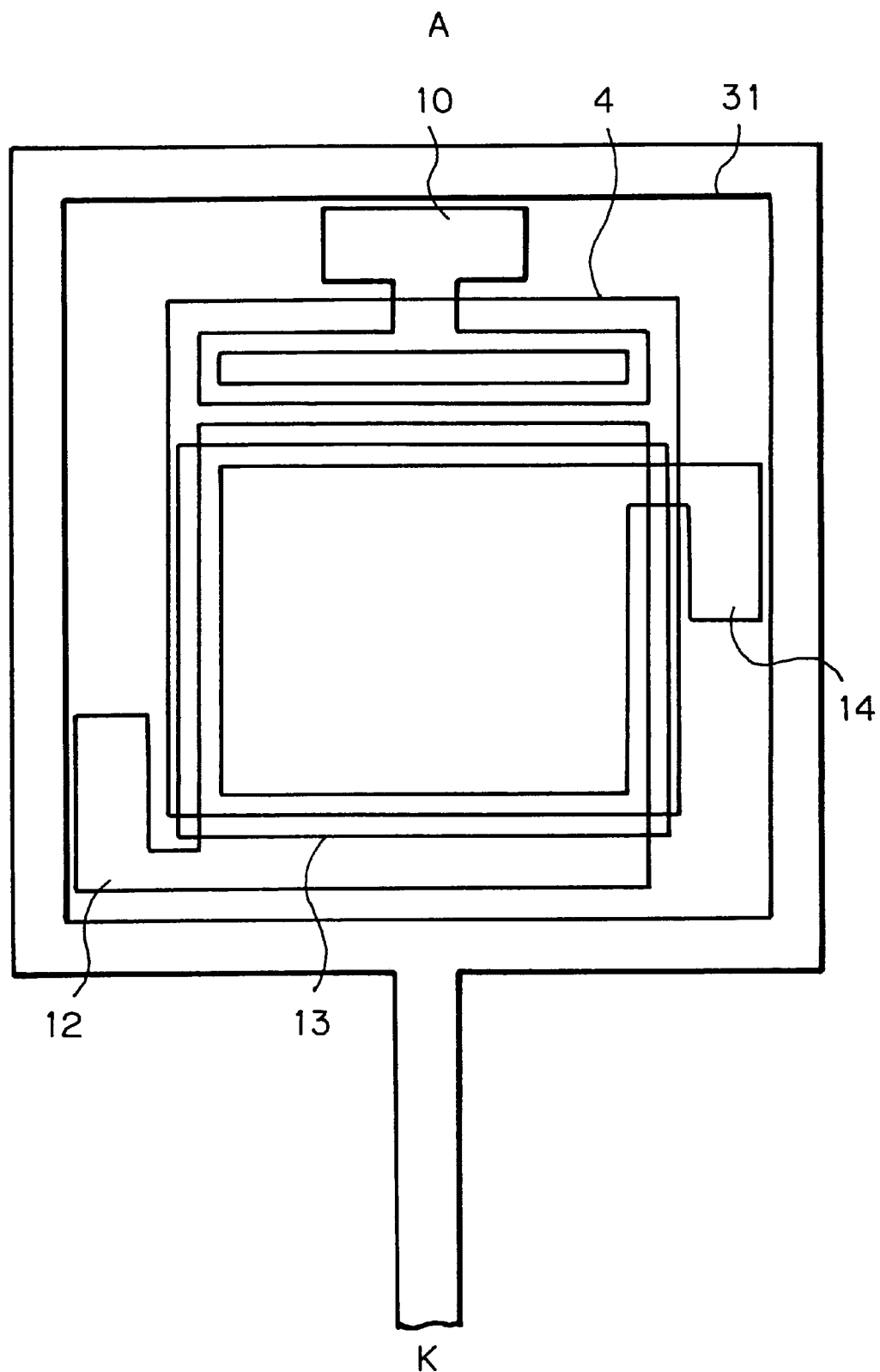
FIG. 14 is a plan view of the third embodiment.
Figure 15:
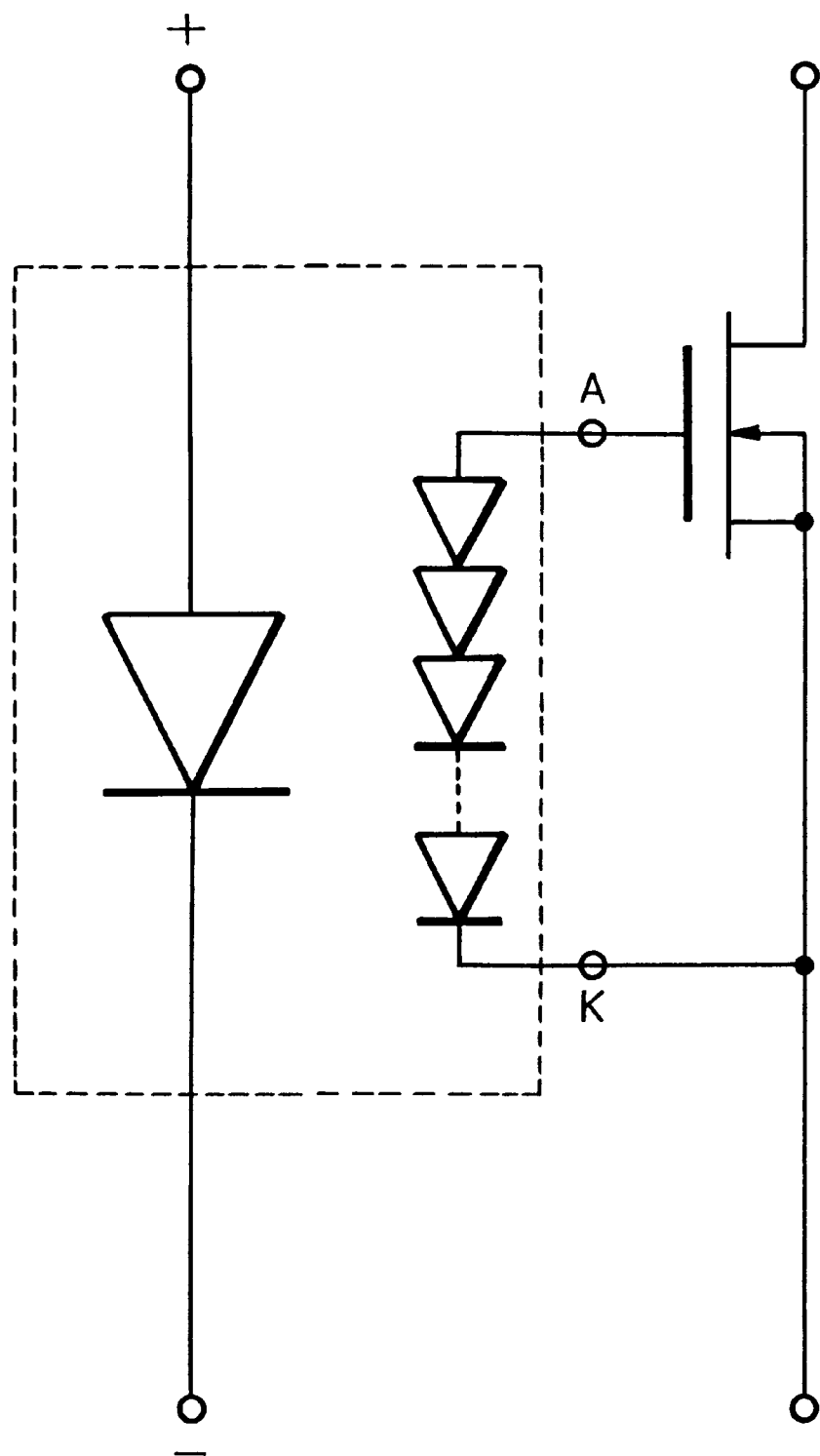
FIG. 15 shows an equivalent circuit representative of the third embodiment.

FIGS. 13–15 show a third embodiment of the present invention which uses a photodiode as a photodetector in place of a thyristor. Specifically, in this embodiment, a photodiode implemented by an Si device is formed, and then an organic thin film EL device is formed on the photodiode. The photodiode drives a switching device in order to, e.g., drive the gate of a power MOSFET (Metal Oxide Semiconductor Field Effect Transistor).

More specifically, as shown in FIG. 13, the $SiO_2$ films 2 are formed on both major surfaces of the N type Si substrate or wafer 1. After a hole has been formed in the front $SiO_2$ film 2 by photolithography, a P type impurity is diffused in the substrate 1 via the hole in order to form the first diffusion layer 4. An N type impurity is diffused in the substrate 1 via the entire rear of the substrate 1 so as to form the second diffusion layer 7. After the hole 6 has been formed in the grown $SiO_2$ film, not shown, by photolithography, a thin Al film is formed by sputtering or similar technology and then patterned to form the metal electrode 10. The protection layer, not shown, transparent electrode 12, organic thin film 13 and metal electrode 14 are sequentially formed on the metal electrode 10. Each layer is patterned in the same manner as in the first embodiment.

As shown in FIG. 14, the Si substrate 1 is diced to separate a chip 31. The chip 31 is bonded to the island of the lead frame 17 by die bonding using the adhesive 18. In this embodiment, for the adhesive 18, use is made of a conductive material. The second diffusion layer 7 shown in FIG. 13 is used to form desirable ohmic contact. Subsequently, the chip 31 is connected to the leads of the lead frame by wire bonding and then sealed with the resin 19, not shown. This is followed by the procedure described in relation to the first embodiment.

Assume that the terminal K shown in FIG. 13 is held at a reference potential. Then, the terminal A is biased to a negative potential with the result that the depletion layer 20 is formed in the PN junction of the photodiode. A current is caused to flow from the anode to the cathode, causing the organic thin film 13 to emit light. The light is propagated through the transparent electrode 12 and $SiO_2$ film 2 to be incident to and around the depletion layer 20. As a result, an optical electromotive force is generated in the photodiode. In a plan view shown in FIG. 14, the chip 31 is sized about 350 μm×350 μm. FIG. 15 shows the relay by using electric symbols. The photodiode is connected to the gate of a power MOSFET so as to drive it. The multistep configuration shown in FIG. 15 guarantees a required drive voltage. The photodiode playing the role of a photodetector may be replaced with a phototransistor as popular as the photodiode, if desired.

In summary, it will be seen that the present invention provides a solid relay and a method of producing the same which have various unprecedented advantages, as enumerated below.

(1) A photodetector can be implemented by a general-purpose Si device, i.e., a planer thyristor produced on a quantity basis.

(2) By using the wafer produced on a quantity basis and by adding a CVD process well adaptive to the Si device production process, it is possible to form the organic thin film EL device of a light emitter on the protection film of the Si element easily.

(3) Because the light emitter and photodetector are separated by an $SiO_2$ film or similar insulation film included in the process of the above item (2), they achieve a high breakdown voltage. This sets up desirable insulation between a high voltage, great current main circuit to be connected to the photodetector and a low voltage, small current control circuit.

(4) Because the light emitter and photodetector are constructed integrally with each other, the relay can be assembled more easily than a two-chip type solid relay extensively used today. A conventional compound semiconductor device, although having a unitary structure, is problematic as to the material of electrodes, stability of characteristic, degree of refinement of production facilities and so forth. The present invention solves this problem also by using the Si device assembling process.

Various modifications will become possible for those skilled in the art after receiving the teachings of the present disclosure without departing from the scope thereof.

What is claimed is:

1. A solid relay for controlling power or current at an output side in response to a control signal input to an input side, comprising:

a light emitter located at the input side;

a photodetector located at the output side and optically coupled to said light emitter; and a plurality of wires electrically connected to said photodetector;

said photodetector comprising a planer Si device, said light emitter comprising a thin film EL device formed on a transparent insulating protection film covering said planer Si device;

wherein said plurality of wires pass through said transparent insulating protection film to output side connections, where said output side connections are not positioned above a diffusion layer of said planar Si device.

2. A solid relay as claimed in claim 1, wherein said photodetector and said light emitter comprise a planer thyristor and an organic thin film EL device, respectively.

3. A solid relay as claimed in claim 2, wherein said organic thin film EL device constituting said light emitter is formed on said photodetector by CVD.

4. A solid relay as claimed in claim 1, wherein the output side comprises said photodetector and a power switching device.

5. A solid relay as claimed in claim 4, wherein said photodetector comprises at least one phototransistor or at least one photodiode, said power switching device comprising a power MOSFET.

6. A solid relay as claimed in claim 1, wherein said thin film EL device is formed of an inorganic material.

7. A solid relay as claimed in claim 1, wherein said light emitter is laminated on said photodetector by batch processing in a form of a wafer.

8. A solid relay as claimed in claim 7, wherein a block consisting of said light emitter, said photodetector and said plurality of wires is separated from the wafer in the form of a chip, then mounted to an island of a lead frame by die bonding, then connected by said plurality of wires to leads of the lead frame by wire bonding, and then sealed with resin to thereby form a package.

9. A solid relay as claimed in claim 1, wherein said transparent insulating protection film comprises a $SiO_2$ film.

10. A solid relay as claimed in claim 1, wherein said transparent insulating protection film comprises a PSG film.

* * * * *